(12) United States Patent
Lee et al.

(10) Patent No.: US 11,714,347 B2
(45) Date of Patent: Aug. 1, 2023

(54) PROCESS PROXIMITY CORRECTION METHOD AND THE COMPUTING DEVICE FOR THE SAME

(71) Applicant: Samsung Electronics Co., Ltd., Suwon-si (KR)

(72) Inventors: Soo Yong Lee, Yongin-si (KR); Min-Cheol Kang, Hwaseong-si (KR); U Seong Kim, Hwaseong-si (KR); Seung Hune Yang, Seoul (KR); Jee Yong Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 279 days.

(21) Appl. No.: 17/245,947

(22) Filed: Apr. 30, 2021

(65) Prior Publication Data

US 2022/0035237 A1 Feb. 3, 2022

(30) Foreign Application Priority Data

Jul. 29, 2020 (KR) ........................ 10-2020-0094254

(51) Int. Cl.
| | |
|---|---|
| *G03F 1/36* | (2012.01) |
| *G03F 1/76* | (2012.01) |
| *G06T 3/40* | (2006.01) |
| *G06T 7/00* | (2017.01) |

(Continued)

(52) U.S. Cl.
CPC ............... *G03F 1/36* (2013.01); *G03F 1/76* (2013.01); *G06F 30/3323* (2020.01); *G06F 30/392* (2020.01); *G06T 3/4046* (2013.01); *G06T 7/0006* (2013.01); *G06T 2207/20084* (2013.01); *G06T 2207/30148* (2013.01)

(58) Field of Classification Search
CPC . G03F 1/36; G03F 1/76; G06T 3/4046; G06T 7/0006; G06T 2207/20084; G06T 2207/30148; G06T 3/40; H01L 21/0273; H01L 21/76816; H01L 22/12; G06N 3/08; G06N 20/00; G06F 30/392; G06F 30/3323
See application file for complete search history.

(56) References Cited

U.S. PATENT DOCUMENTS

| | | |
|---|---|---|
| 10,198,550 B2 | 2/2019 | Lutich |
| 10,521,539 B2 | 12/2019 | Yu et al. |
| 10,534,257 B2 | 1/2020 | Tetiker et al. |

(Continued)

FOREIGN PATENT DOCUMENTS

| | | |
|---|---|---|
| KR | 20210133364 A | 11/2021 |
| WO | 2017171890 A1 | 10/2017 |

*Primary Examiner* — Stacy Whitmore
(74) *Attorney, Agent, or Firm* — Muir Patent Law, PLLC

(57) ABSTRACT

A process proximity correction method is performed by a process proximity correction computing device which performs a process proximity correction (PPC) through at least one of a plurality of processors. The process proximity correction method includes: converting a target layout including a plurality of patterns into an image, zooming-in or zooming-out the image at a plurality of magnifications to generate a plurality of input channels, receiving the plurality of input channels and performing machine learning to predict an after-cleaning image (ACI), comparing the predicted after-cleaning image with a target value to generate an after-cleaning image error, and adjusting the target layout on the basis of the after-cleaning image error.

20 Claims, 10 Drawing Sheets

(51) Int. Cl.
*G06F 30/3323* (2020.01)
*G06F 30/392* (2020.01)

(56) References Cited

U.S. PATENT DOCUMENTS

| | | | |
|---|---|---|---|
| 10,579,764 | B2 | 3/2020 | Sha et al. |
| 11,069,082 | B1* | 7/2021 | Ebrahimi Afrouzi ... G06T 7/593 |
| 11,182,530 | B1* | 11/2021 | Marinelli ............ G06F 30/3947 |
| 11,544,440 | B2* | 1/2023 | Van Den Brink .... G06F 30/398 |
| 2002/0133801 | A1* | 9/2002 | Granik ...................... G03F 1/80 716/52 |
| 2007/0094634 | A1* | 4/2007 | Seizginer .................. G03F 1/36 716/54 |
| 2008/0141195 | A1* | 6/2008 | Torres Robles ...... G06F 30/398 716/54 |
| 2011/0224945 | A1* | 9/2011 | Shim ........................ G03F 1/36 702/150 |
| 2013/0219349 | A1* | 8/2013 | Lee .......................... G03F 1/36 716/53 |
| 2018/0173090 | A1* | 6/2018 | Wang ....................... G03F 1/36 |
| 2020/0004921 | A1 | 1/2020 | Baidya et al. |
| 2020/0050099 | A1 | 2/2020 | Su et al. |
| 2021/0173999 | A1* | 6/2021 | Lefferts ................. G06F 30/367 |
| 2021/0334444 | A1* | 10/2021 | Lee ........................... G03F 1/36 |
| 2021/0374316 | A1* | 12/2021 | Xu .......................... G06F 17/00 |
| 2022/0392011 | A1* | 12/2022 | Lee ....................... G06T 1/0014 |

* cited by examiner

FIG. 3a

| | | | | | | | | | |
|---|---|---|---|---|---|---|---|---|---|
|0.0|0.0|0.0|0.0|0.0|0.0|0.0|0.0|0.0|0.0|
|0.0|1.0|1.0|1.0|1.0|1.0|0.0|0.0|0.0|0.0|
|0.0|1.0|1.0|1.0|1.0|1.0|0.0|0.0|0.0|0.0|
|0.0|1.0|1.0|1.0|1.0|1.0|0.0|0.0|0.0|0.0|
|0.0|1.0|1.0|1.0|1.0|1.0|0.0|0.0|0.0|0.0|
|0.0|0.0|1.0|1.0|1.0|0.0|0.0|1.0|1.0|0.0|
|0.0|0.0|0.0|0.0|0.0|0.0|0.0|1.0|1.0|0.0|
|0.0|0.0|0.0|0.0|0.0|0.0|0.0|1.0|1.0|0.0|
|0.0|0.0|0.0|0.0|0.0|0.0|0.0|0.0|0.0|0.0|
|0.0|0.0|0.0|0.0|0.0|0.0|0.0|0.0|0.0|0.0|

I, II, III

FIG. 3b

| | | | | | | | | | |
|---|---|---|---|---|---|---|---|---|---|
| 0.0 | 0.0 | 0.0 | 0.0 | 0.0 | 0.0 | 0.0 | 0.0 | 0.0 | 0.0 |
| 0.0 | 1.0 | 1.0 | 1.0 | 1.0 | 0.5 | 0.0 | 0.0 | 0.0 | 0.0 |
| 0.0 | 1.0 | 1.0 | 1.0 | 1.0 | 0.5 | 0.0 | 0.0 | 0.0 | 0.0 |
| 0.0 | 1.0 | 1.0 | 1.0 | 1.0 | 0.5 | 0.0 | 0.0 | 0.0 | 0.0 |
| 0.0 | 0.5 | 1.0 | 1.0 | 1.0 | 0.5 | 0.0 | 0.0 | 0.0 | 0.0 |
| 0.0 | 0.0 | 1.0 | 1.0 | 1.0 | 0.0 | 0.0 | 0.5 | 0.5 | 0.0 |
| 0.0 | 0.0 | 0.0 | 0.0 | 0.0 | 0.0 | 0.0 | 1.0 | 1.0 | 0.0 |
| 0.0 | 0.0 | 0.0 | 0.0 | 0.0 | 0.0 | 0.0 | 1.0 | 1.0 | 0.0 |
| 0.0 | 0.0 | 0.0 | 0.0 | 0.0 | 0.0 | 0.0 | 0.0 | 0.0 | 0.0 |
| 0.0 | 0.0 | 0.0 | 0.0 | 0.0 | 0.0 | 0.0 | 0.0 | 0.0 | 0.0 |

FIG. 3c

PROCESS PROXIMITY CORRECTION METHOD AND THE COMPUTING DEVICE FOR THE SAME

This application claims priority under 35 U.S.C. § 119 to Korean Patent Application No. 10-2020-0094254, filed on Jul. 29, 2020, the disclosure of which is incorporated herein by reference in its entirety.

BACKGROUND

1. Technical Field

The present disclosure relates to a process proximity correction method and a computing device.

2. Description of the Related Art

A semiconductor process for fabricating semiconductor devices is implemented by a combination of various procedures such as etching, depositing, planarization, growth, and implantation. Etching may be performed by forming a photoresist pattern on a target and removing portions of the target not covered by photoresist through chemicals, gas, plasma, ion beams, or the like.

In the process of etching, process errors may occur due to various factors. The factors that induce the process errors may be due to the characteristics of the process, but may also be due to characteristics of the pattern of the photoresist or the semiconductor pattern implemented by etching. Process errors due to characteristics of a pattern may be compensated for by modifying or changing the layout of the patterns.

With an increase in degree of integration of semiconductor device and miniaturization of the semiconductor process, the number of patterns included in the semiconductor layout rapidly increases. Therefore, as an amount of calculation for modifying or changing the layout of patterns also increases rapidly to compensate for the process error, a process proximity correction method (PPC) using machine learning (ML) comes to the fore.

SUMMARY

Aspects of the present inventive concept provide a process proximity correction method with improved HARC (High Aspect Ratio Contact).

Aspects of the present inventive concept provide A process proximity correction computing device with improved HARC (High Aspect Ratio Contact).

However, aspects of the present inventive concept are not restricted to the ones set forth herein. The above and other aspects of the present inventive concept will become more apparent to one of ordinary skill in the art to which the present inventive concept pertains by referencing the detailed description of the present inventive concept given below.

According to an aspect of the present inventive concept, a process proximity correction method performed by a process proximity correction computing device which performs a process proximity correction (PPC) through at least one of a plurality of processors includes: converting a target layout including a plurality of patterns into an image, zooming-in or zooming-out the image at a plurality of magnifications to generate a plurality of input channels, receiving the plurality of input channels and performing machine learning to predict an after-cleaning image (ACI), comparing the predicted after-cleaning image with a target value to generate an after-cleaning image error, and adjusting the target layout on the basis of the after-cleaning image error.

According to an aspect of the present inventive concept, a process proximity correction method of a process proximity correction computing device which performs a process proximity correction (PPC) through at least one of a plurality of processors. includes: converting a target layout including a plurality of patterns into a first image, generating a first input channel by obtaining a first zoomed out version of the first image at a first magnification, and generating a second input channel by obtaining a second zoomed out version of the first image at a second magnification, receiving the first input channel and the second input channel and performing machine learning to predict an after-cleaning image (ACI), comparing the predicted after-cleaning image with a target value to generate after-cleaning image error; and adjusting the target layout and converting the target layout into a second image different from the first image, on the basis of the after-cleaning image error.

According to an aspect of the present inventive concept, a process proximity correction computing device includes a plurality of processors, wherein at least one of the plurality of processors executes a process proximity correction. Execution of the process proximity. Correction includes: zooming-in or zooming-out the image at a plurality of magnifications to generate a plurality of input channels, receiving the plurality of input channels and performing machine learning to predict after-cleaning image (ACI), comparing the predicted after-cleaning image with a target value to generate an after-cleaning image error, and adjusting the target layout on the basis of the after-cleaning image error.

BRIEF DESCRIPTION OF THE DRAWINGS

The above and other aspects and features of the present inventive concept will become more apparent by describing in detail exemplary embodiments thereof with reference to the attached drawings, in which:

FIGS. 3a to 3c are exemplary diagrams showing an image conversion method according to some embodiments.

DETAILED DESCRIPTION OF THE EMBODIMENTS

Figure 1:
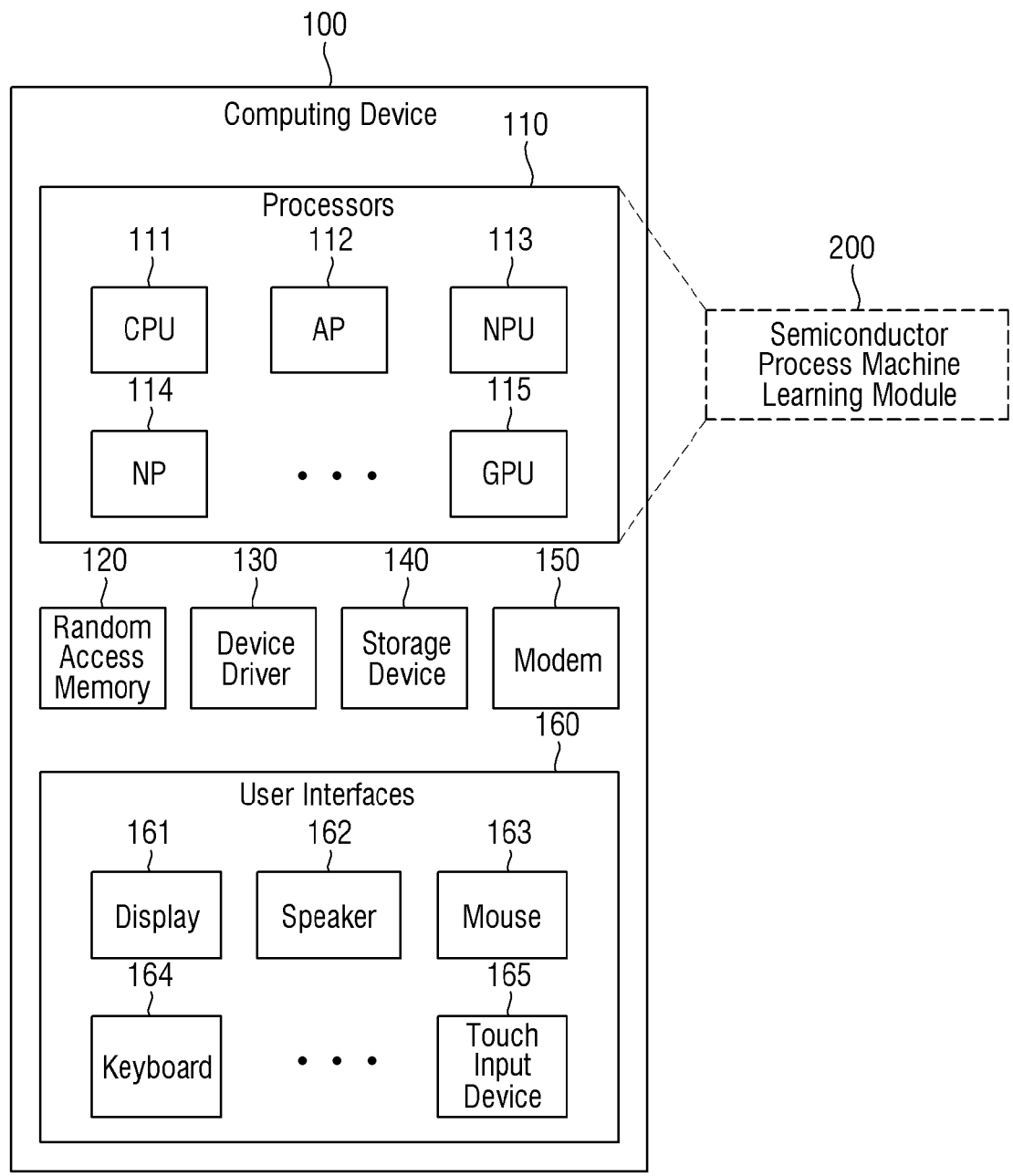
FIG. 1 is an exemplary block diagram showing a process proximity correction computing device according to some embodiments.

FIG. 1 is an exemplary block diagram showing a process proximity correction computing device according to some embodiments.

Referring to FIG. 1, a computing device 100 according to some embodiments may include a plurality of processors 110, a random access memory 120, a device driver 130, a storage device 140, a modem 150, and user interfaces 160.

At least one of the processors 110 may execute a semiconductor process machine learning module 200. The semiconductor process machine learning module 200 may generate a layout for fabricating a semiconductor device on the basis of machine learning. For example, the semiconductor process machine learning module 200 may be implemented in the form of commands (or codes) executed by at least one of the processors 110 (also described as software or computer program code executed by hardware). At this time, at least one processor may load the commands (or codes) of the semiconductor process machine learning module 200 into the random access memory 120.

As another example, at least one processor may be fabricated to implement the semiconductor process machine learning module 200. As another example, at least one processor may be fabricated to implement various machine learning modules. At least one processor may implement the semiconductor process machine learning module 200, by receiving information corresponding to the semiconductor process machine learning module 200.

A layout may be generated, on the basis of process proximity correction (PPC) through the semiconductor process machine learning module 200 executed through at least one of a plurality of processors 110 according to some embodiments.

The process proximity correction (PPC) according to some embodiments may predict information about an ACI (After-cleaning image) state by a photo process (e.g., etching) on a target layout subjected to the process proximity correction (PPC). In detail, critical dimensions (CD) of a plurality of patterns according to after-cleaning image (ACI) state of the target layout may be predicted through the process proximity correction (PPC) method according to some embodiments.

At this time, the plurality of processors 110 according to some embodiments convert the layout into an image and then execute deep learning to obtain a loading effect of a wide range (for example, 100 micrometers) through the process proximity correction. For example, when the process proximity correction is performed on the basis of only information about adjacent parts of particular patterns in the layout in which the process proximity correction is performed, because the number of base data used for after-cleaning image (ACI) prediction is very small, after-cleaning image (ACI) prediction accuracy may be reduced as compared to predictions based on combinations of various patterns. Therefore, the plurality of processors 110 according to some embodiments convert the layout into an image, extract the image information of the image corresponding to various magnifications, and may perform after-cleaning image (ACI) prediction on the target layout. The above deep learning can be executed over artificial neural networks, and the artificial neural networks can include deep neural networks (DNNs), (e.g. convolutional neural networks (CNNs), Recurrent neural networks (RNNs), Restructured Boltzmann machines (RBMs), DBN (Deep Belief), or BRIDNs (BRD), but are not limited thereto).

Since the amount of information used for the process proximity correction increases exponentially in the plurality of processors 110 according to some embodiments, an after-cleaning image (ACI) may be predicted efficiently using the machine learning (or deep learning).

Also, when executing the semiconductor process machine learning module 200 executed through at least one of a plurality of processors 110 according to some embodiments, when generating a layout on the basis of the process proximity correction (PPC), it is possible to utilize a deep learning network made up of multi-channels according to the length scale of the plurality of patterns placed in the layout. For example, the input channel which is input to machine learning may be made up of a plurality of different input channels. Accordingly, it is possible to improve integrity and dispersion of various forms of contacts, more specifically, high aspect ratio contacts (HARC). A detailed explanation thereof will be provided through FIGS. 2 to 10 to be described later.

The processors 110 may include, for example, at least one general purpose processor such as a central processing unit (CPU) 111 and an application processor (AP). The processors 110 may also include at least one special purpose processor such as a neural processing unit 113, a neuromopic processor 114 and a graphic processing unit (GPU) 115. The processors 110 may include two or more same type of processors.

The random access memory 120 is used as the operating memory of the processor 110 and may be used as a main memory or a system memory of the computing device 100. The random access memory 120 may include a volatile memory such as a dynamic random access memory or a static random access memory, or a non-volatile memory such as a phase change random access memory, a ferroelectric random access memory, a magnetic random access memory or a resistive random access memory.

The device driver 130 may control peripheral devices such as a storage device 140, a modem 150, and a user interface 160 at the request of the processors 110. The storage device 140 may include fixed storage devices such as a hard disk drives and a solid state drive, or detachable storage devices such as an external hard disk drive, an external solid state drive and a detachable memory card.

The modem 150 may provide remote communication with an external device. The modem 150 may perform wireless or wired communication with the external device. The modem 150 may communicate with the external device through at least one of various communication types, such as Ethernet, Wi-Fi, LTE, and 5G mobile communications.

The user interfaces 160 may receive information from the user and provide the information to the user. The user interfaces 160 may include at least one user output interface such as a display 161 and a speaker 162, and at least one user input interface such as a mouse 163, a keyboard 164 and a touch input device 165.

In one embodiment, the commands (or codes) of the semiconductor process machine learning module 200 are received through the modem 150 and may be stored in the storage device 140. The commands (or codes) of the semiconductor process machine learning module 200 may be stored in a detachable storage device and may be coupled to the computing device 100. The commands (or codes) of the semiconductor process machine learning module 200 may be loaded from the storage device 140 to the random access memory 120 and executed.

Figure 2:
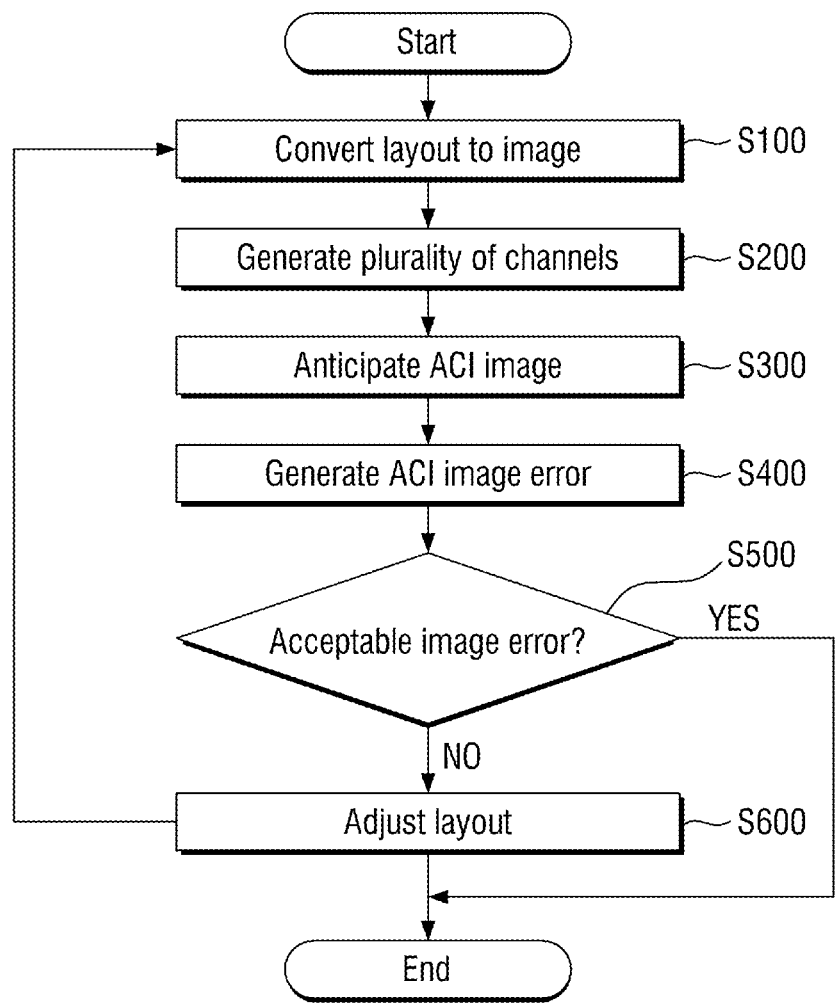
FIG. 2 is an exemplary flowchart showing the process proximity correction method according to some embodiments.

FIG. 2 is an exemplary flowchart showing the process proximity correction method according to some embodiments.

FIGS. 1 and 2 show a process in which at least one of the plurality of processors 110 according to some embodiments generates a layout, as an example. In detail, at least one of the plurality of processors 110 according to some embodiments may execute the semiconductor process machine learning module 200. After that, the semiconductor process machine learning module 200 according to some embodiments may generate a layout for fabricating a semiconductor device on the basis of machine learning. In detail, the semiconductor process machine learning module 200 according to some embodiments may perform the process proximity correction (PPC) on the layout for fabricating the semiconductor device.

A layout may be generated on the basis of process proximity compensation (PPC) through the semiconductor process machine learning module 200 executed through at least one of the plurality of processors 110 according to some embodiments. The plurality of processors 110 according to some embodiments may convert the layout into an image and then execute deep learning to obtain a wide range of loading effect through the process proximity correction.

Also, when executing the semiconductor process machine learning module 200 executed through at least one of the plurality of processors 110 according to some embodiments, when generating the layout on the basis of process proximity correction (PPC), it is possible to utilize a deep learning network made up of multi-channels according to the length scale of the plurality of patterns placed in the layout. Accordingly, it is possible to improve integrity and dispersion of various forms of contacts, more specifically, high aspect ratio contacts (HARC).

First, at least one of the plurality of processors 110 according to some embodiments converts a layout (e.g., a target layout) to be subjected to the process proximity correction into an image on which to perform the process proximity correction (S100).

In at least one of the plurality of processors 110 according to some embodiments, the target layout used to perform the process proximity correction may be made up of, for example, vector data. At this time, when the target layout is converted into an image, the target layout may be generated as an image, by converting the vectors of the target layout into pixels.

Examples in which at least one of the plurality of processors 110 according to some embodiments converts a layout to be subjected to the process proximity correction into an image on which to perform the process proximity correction will be explained in FIG. 3a to FIG. 3c.

Figure 3C:
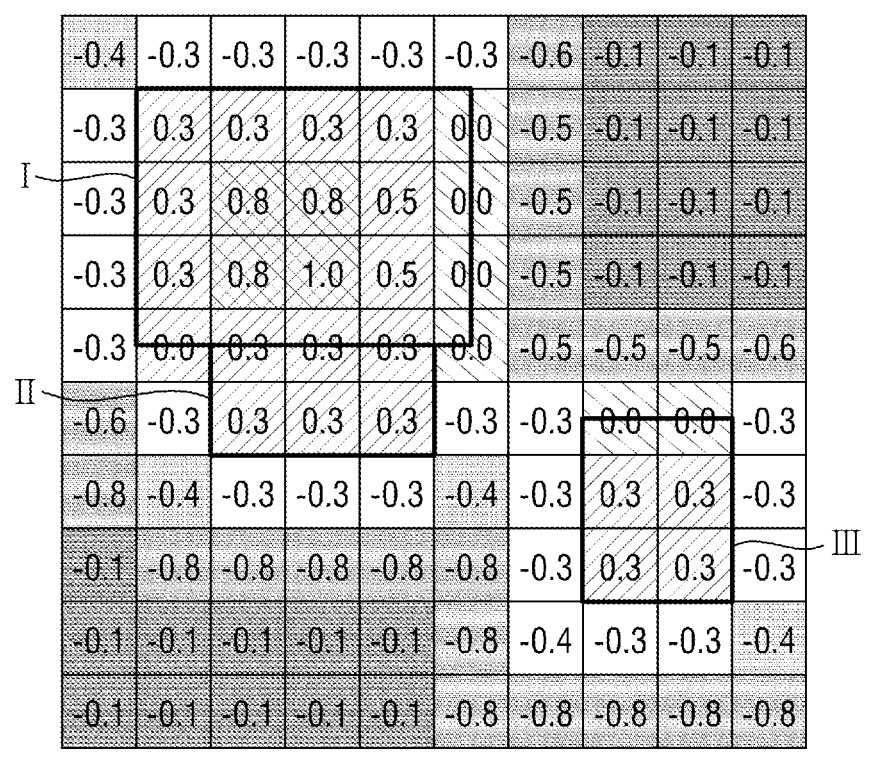

FIGS. 3a to 3c are exemplary diagrams showing an image conversion method according to some embodiments.

Referring to FIGS. 1 and 3a, at least one of the plurality of processors 110 according to some embodiments may utilize a binary algorithm type, when a layout to be subjected to the process proximity correction is converted into an image on which to perform the process proximity correction.

For example, in the target layout on which the process proximity correction according to some embodiments is executed, pixels corresponding to the regions I, II and III to be corrected may be specified as "1", and pixels corresponding to remaining regions may be specified as "0".

At this time, because the pixel in which edges of the regions I, II and III to be corrected cover at least a part of the pixel is specified as "1" or "0", the accuracy when converting the target layout into an image may be slightly lowered. However, a turnaround time (TAT) may be reduced through simplification of conversion. Another example of conversion of the target layout into an image using the binary algorithm type will be explained.

In the explanation of binary algorithm type according to some embodiments, the type of the value specified in a pixel may differ from the aforementioned explanation. For example, in the target layout on which the process proximity correction according to some embodiments is performed, the pixels corresponding to the regions I, II and III to be corrected may be specified as "0", and the pixel corresponding to the remaining regions may be specified as "1".

Referring to FIGS. 1 and 3b, at least one of the plurality of processors 110 according to some embodiments may utilize an area overlap algorithm type, when converting a layout to be subjected to the process proximity correction into an image on which to perform the process proximity correction.

For example, in the target layout on which the process proximity correction according to some embodiments is to be executed, pixels corresponding to regions I, II and III to be corrected may be specified as "1", and pixels corresponding to remaining region may be specified as "0". Also, pixels in which edges of the regions I, II and III to be corrected crosses at least a part of the pixel may be specified as "0.5".

Since the pixel in which the edges of the regions I, II and III to be corrected covers at least a part of the pixel is specified as "1" or "0" in the binary algorithm type, the accuracy when converting the target layout into an image may be slightly lowered. Therefore, in the area overlap algorithm type, because the pixel in which edges of the regions I, II and III to be corrected cover at least a part of the pixels is specified as a value (for example, 0.5) other than "1" and "0", the accuracy when converting the layout into the image may be further improved, as compared to the binary algorithm type.

However, in the area overlap algorithm type according to some embodiments, because the type of information specified for each pixel is more diverse than the binary algorithm type according to some embodiments, the turnaround time (TAT) of the area overlap algorithm type may be increased over the turnaround time (TAT) in the binary algorithm type.

Therefore, at least one of the plurality of processors 110 according to some embodiments may convert the target layout into an image by selecting the required conversion type depending on the correction situation, when converting a layout subjected to the process proximity correction into an image to perform the process proximity correction. For example, in a situation that requires faster turnaround time (e.g., an amount of time less than a threshold amount), a binary conversion type can be used, and in a situation where a faster turnaround time is not needed (e.g., an amount of time greater than a threshold amount is allowable), an area overlap algorithm can be used.

Referring to FIGS. 1 and 3c, at least one of the plurality of processors 110 according to some embodiments may utilize a level set type, when converting a layout to be subjected to the process proximity correction into an image on which to perform the process proximity correction.

For example, in the target layout on which the process proximity correction is to be performed according to some embodiments, the pixel in which the exposed edges of the regions I, II and III to be corrected cross at least a part of the pixel may be specified as "0". After that, a value larger than "0" may be specified for the pixels located inside the regions I, II and III to be corrected. The value specified from the pixels close to the pixel specified as "0" to the pixels located away from the pixels specified as "0" may further increase. For example, pixels located within the regions I, II and III to be corrected and near the edges of the regions I, II and III to be corrected may be specified as "0.3". Further, pixels located farther than the pixels specified as "0.3" from the pixel specified as "0" may be specified as "0.5". Also, pixels located farther than the pixels specified as "0.3" and located farther than the pixel specified as "0.5" from the pixel specified as "0" may be specified as "0.8". Also, the pixels, which are located farther than the pixels specified as "0.3", located farther than the pixels specified as "0.5" and located farther than the pixels specified as "0.8" from the pixel specified as "0", may be specified as "1.0".

Also, in the target layout on which the process proximity correction according to some embodiments is to be performed, after the pixel in which the edges of the regions I, II and III to be corrected cross at least a part of the pixel is specified as "0", a value smaller than "0" may be specified for pixels located outside the regions I, II and III to be corrected. The value specified from the pixels close to the pixel specified as "0" to the pixels located away from the pixels specified as "0" may further decrease. For example, pixels located within the regions I, II and III to be corrected and near the edges of the regions I, II and III to be corrected may be specified as "−0.5". Also, pixels located farther than the pixels specified as "−0.5" from the pixels specified as "0" may be specified as "−1.0".

Because the pixels in which the edges of the regions I, II and III to be corrected cover at least a part of the pixel is specified as "1" or "0" in the binary algorithm type, the accuracy when converting the target layout into an image may be slightly lowered. Also, since the values specified for the inner and outer pixels are the same on the basis of the edges of the regions I, II and III to be corrected in the overlap type, the accuracy when converting the target layout into an image may be slightly lowered.

Therefore, in the level set type, on the basis of the edges of the regions I, II and III to be corrected, the value specified for the pixel increases as it comes closer to the inside of the regions I, II and III to be corrected, and the value specified for the pixel decreases as it goes away toward the outside of the regions I, II and III to be corrected. Accordingly, the accuracy when converting the target layout into an image can be further improved, as compared to the binary algorithm type or the overlap type.

However, in the area overlap algorithm type according to some embodiments, because the type of information specified for each pixel is more diverse than the binary algorithm type or the overlap type according to some embodiments, the turnaround time (TAT) of the level set type may increase over the turnaround time (TAT) in the binary algorithm type or the overlap type.

Therefore, when at least one of the plurality of processors 110 according to some embodiments converts a layout to be subjected to the process proximity correction into an image on which to perform the process proximity correction, it is possible to select the desired conversion type depending on the correction situation and convert the target layout into an image.

Referring to FIGS. 1 and 2 again, at least one of the plurality of processors 110 according to some embodiments zooms in or zooms out the image generated through the layout image conversion (S100) at a plurality of magnifications to generate a plurality of input channels to be input to the machine learning (S200).

Through FIGS. 4a through 4c below, a method is described by which at least one of the plurality of processors 110 according to some embodiments zooms in or zooms out an image at a plurality of magnifications to generate a plurality of multi-channel input layers to be input to machine learning.

Figure 4A:
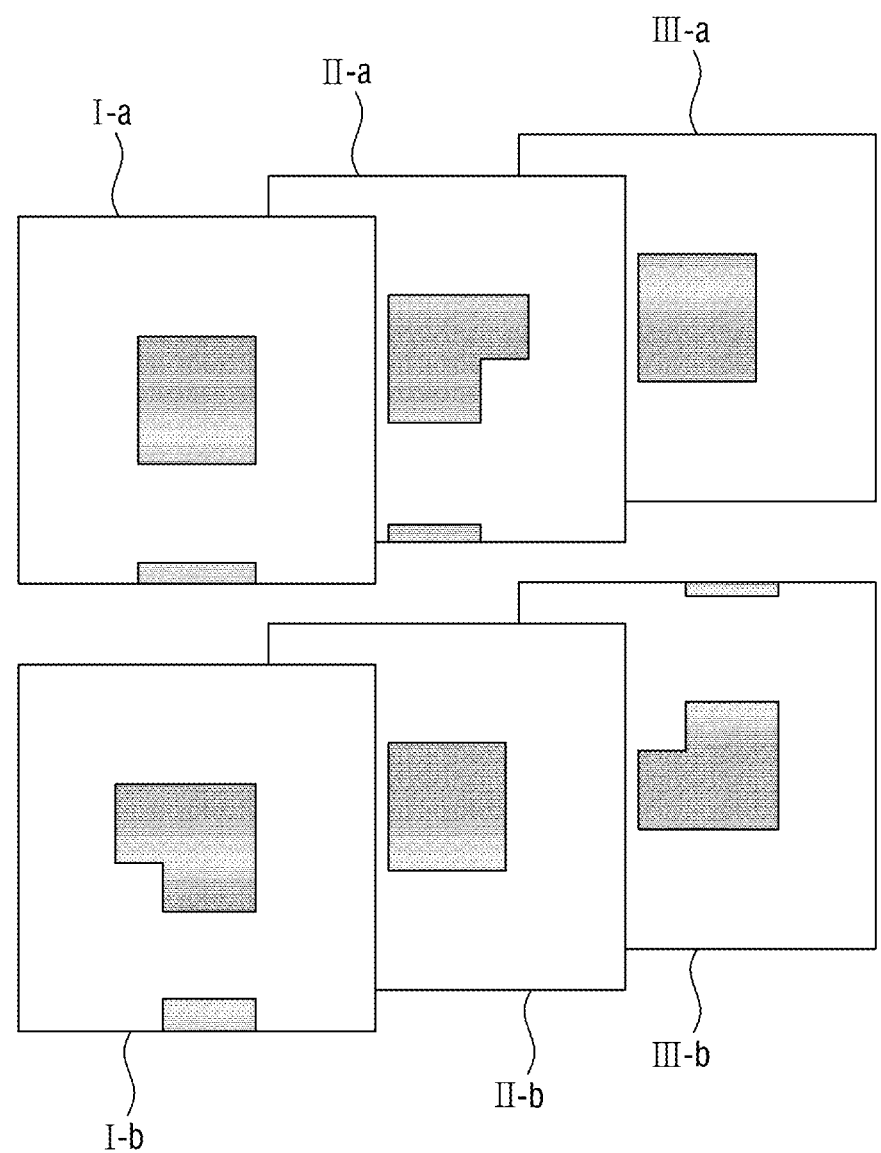
FIGS. 4a through 4c are exemplary diagrams showing a plurality of input channels in which the image according to some embodiments is adjusted at a plurality of magnifications.
Figure 4B:
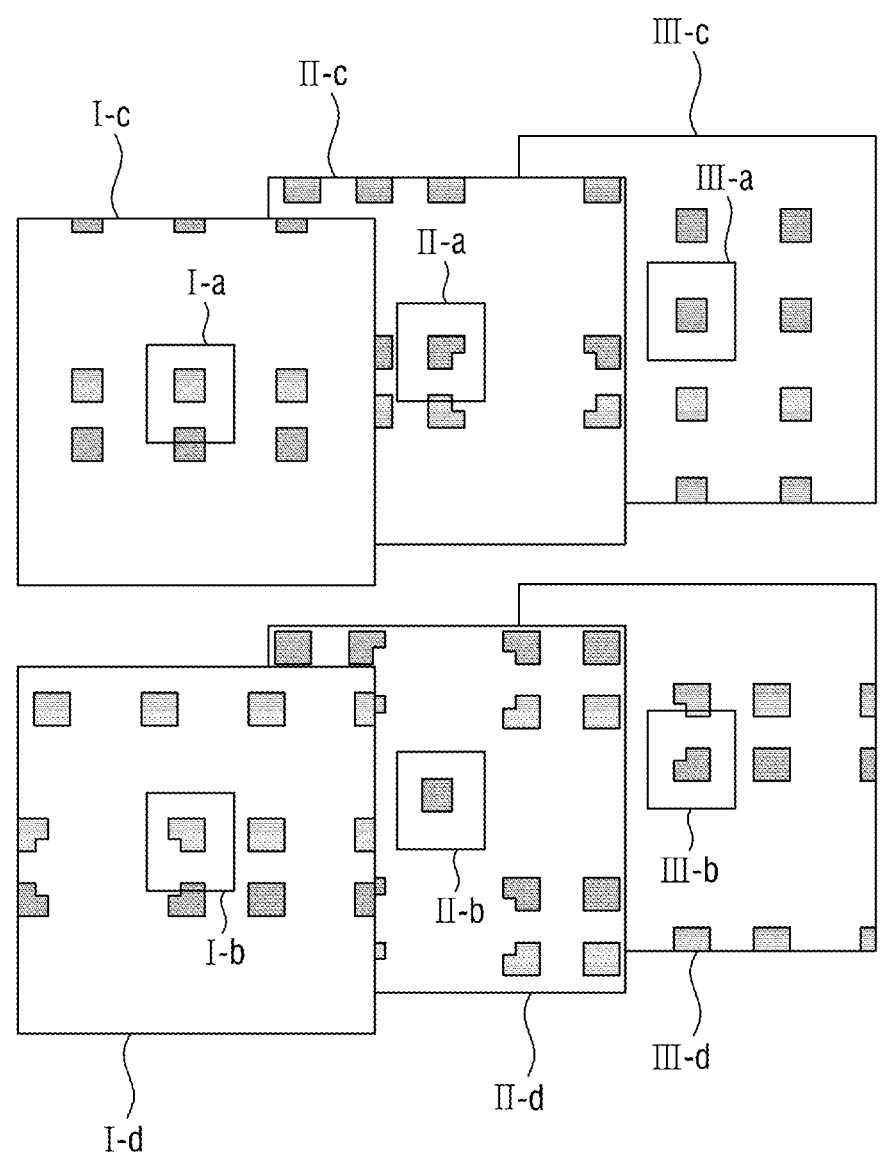
Figure 4C:
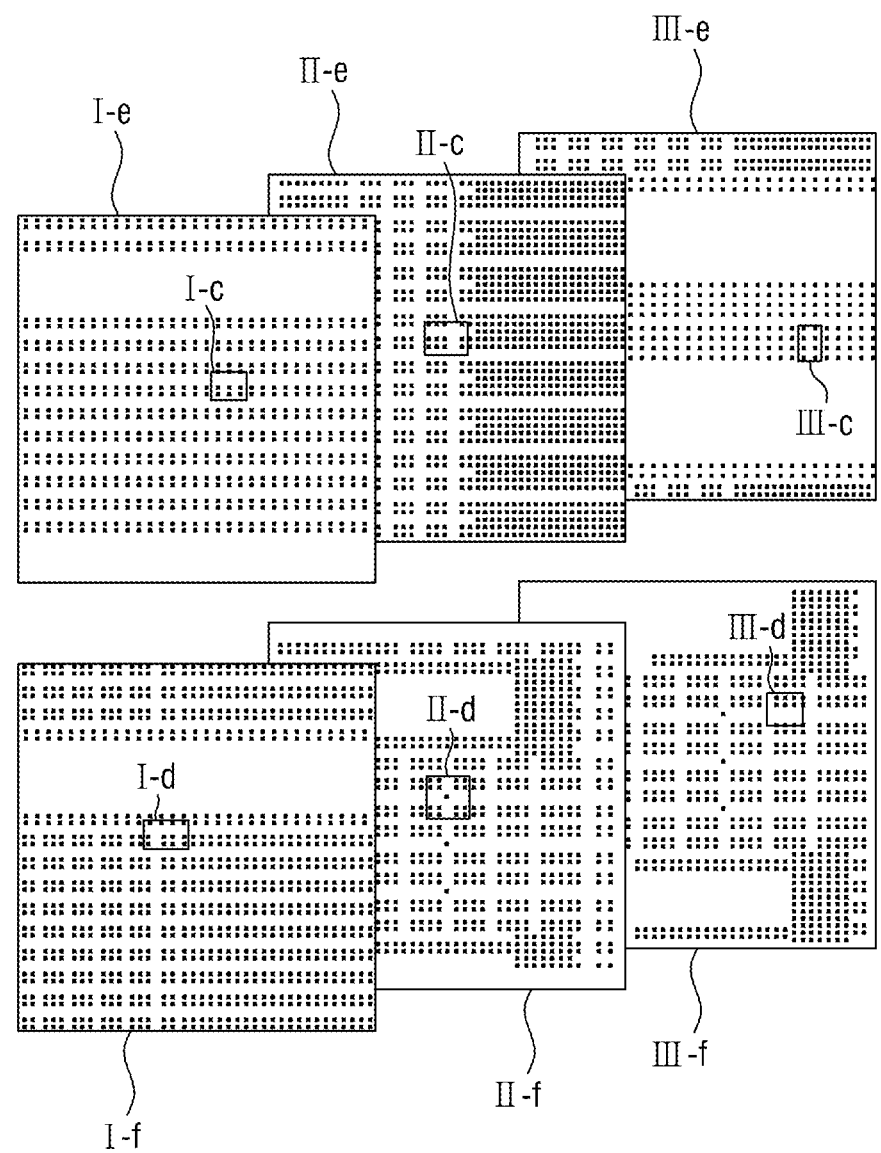

FIGS. 4a through 4c are exemplary diagrams showing a plurality of input channels in which the image according to some embodiments is adjusted at a plurality of magnifications.

Referring to FIGS. 1 and 4a, at least one of the plurality of processors 110 according to some embodiments may utilize the converted image as an input channel for machine learning without a magnification conversion.

For example, at least one of the plurality of processors 110 according to some embodiments may form a plurality of patterns I-a, I-b, II-a, II-b, III-a and III-b to be subjected to the process proximity correction by converting the target layout to an image. The image may be input as an input layer of machine learning without additional magnification adjustment.

Referring to FIGS. 1 and 4b, at least one of the plurality of processors 110 according to some embodiments performs magnification conversion on the converted image and may use it as an input channel for machine learning.

For example, in addition to the input of FIG. 4a as described above, at least one of the plurality of processors 110 according to some embodiments may form a plurality of patterns I-c, I-d, II-c, II-d, III-c and III-d obtained by zooming out on the plurality of patterns I-a, I-b, II-a, II-b, III-a and III-b by 10 times, in the image obtained by converting the target layout. This zoomed out image may be used as an input layer of machine learning.

For example, a target layout may include all of the vectors for a desired set of patterns (e.g., for a desired photolithography mask). An image formed without additional magnification adjustment may include a first portion of the target layout that fills a particular image area and has a certain particular number of pixels in that area. All of the vectors for the first portion of the target layout may be included in an image formed without additional magnification. The zoomed out image may include a second, larger portion of the target layout, that includes the first portion as well as a surrounding region, but that fills the same particular image area and has the same particular number of pixels in that area. A subset less than all of the vectors for the second portion of the target layout may be included in the zoomed out image. "Zooming out" as described herein may refer to forming a second image that is a zoomed out version of the first image.

In detail, at least one of the plurality of processors 110 according to some embodiments may generate a pattern image I-c obtained by zooming out the pattern image I-a by 10 times. Accordingly, at least one of the plurality of processors 110 according to some embodiments may form the pattern image I-a and the pattern image I-c as input channels or input layers of machine learning. Further, at least one of the plurality of processors 110 according to some embodiments may generate a pattern image II-c obtained by zooming out the pattern image II-a by 10 times. Accordingly, at least one of the plurality of processors 110 according to some embodiments may form the pattern image II-a and the pattern image II-c as input channels or input layers of machine learning. Further, at least one of the plurality of processors 110 according to some embodiments may generate a pattern image III-c obtained by zooming out the pattern image III-a by 10 times. Accordingly, at least one of the plurality of processors 110 according to some embodiments may form the pattern image III-a and the pattern image III-c as input channels or input layers of machine learning. Further, at least one of the plurality of processors 110 according to some embodiments may generate a pattern image I-d obtained by zooming out the pattern image I-b by 10 times. Accordingly, at least one of the plurality of processors 110 according to some embodiments may form the pattern image I-b and the pattern image I-d as input channels or input layers of machine learning. Further, at least one of the plurality of processors 110 according to some embodiments may generate a pattern image II-d obtained by zooming out the pattern image II-b by 10 times. Accordingly, at least one of the plurality of processors 110 according to some embodiments may form the pattern image II-b and the pattern image II-d as input channels or input layers of machine learning. Further, at least one of the plurality of processors 110 according to some embodiments may generate a pattern image III-d obtained by zooming out the pattern image III-b by 10 times. Accordingly, at least one of the plurality of processors 110 according to some embodiments may form the pattern image III-b and the pattern image III-d as input channels or input layers of machine learning.

The magnification of the pattern image adjusted by at least one of the plurality of processors 110 according to some embodiments is not limited to 10 times. The magnification may be smaller than 10 times and may be greater than 10 times. A case where the magnification of the pattern image adjusted by at least one of the plurality of processors 110 according to some embodiments is 100 times will be continuously explained, for example, through FIG. 4c.

Referring to FIGS. 1 and 4a, at least one of the plurality of processors 110 according to some embodiments may utilize the converted image as an input channel for machine learning without magnification conversion.

For example, at least one of the plurality of processors 110 according to some embodiments may form a plurality of patterns I-a, I-b, II-a, II-b, III-a and III-b to be subjected to the process proximity correction by converting the target layout to an image, and may input the image as an input layer of machine learning without additional magnification adjustment.

Referring to FIGS. 1 and 4c, at least one of the plurality of processors 110 according to some embodiments performs magnification conversion on the converted image and may use it as an input channel for machine learning.

For example, in addition to the input of FIG. 4a as described above, and in addition to the input of FIG. 4b as described above where 10 times magnification zoomed-out is implemented, at least one of the plurality of processors 110 according to some embodiments may constitute a plurality of patterns I-e, I-f, II-e, II-f, III-e and III-f obtained by zooming out the plurality of patterns I-c, I-d, II-c, II-d, III-c and III-d by 10 times, in the image obtained by converting the target layout. The image without image magnification adjustment, the image with the 10 times image magnification adjustment, and the image with the 100 times image magnification adjustment may all be input as input layers of machine learning.

In detail, at least one of the plurality of processors 110 according to some embodiments may generate a pattern image I-e obtained by zooming out the pattern image I-c by 10 times. At least one of the plurality of processors 110 according to some embodiments may form the pattern image I-c and the pattern image I-e as input channels or input layers of machine learning. Further, at least one of the plurality of processors 110 according to some embodiments may generate a pattern image II-e obtained by zooming out the pattern image II-c by 10 times. At least one of the plurality of processors 110 according to some embodiments may form the pattern image II-c and the pattern image II-e as input channels or input layers of machine learning. Further, at least one of the plurality of processors 110 according to some embodiments may generate a pattern image III-e obtained by zooming out the pattern image III-c by 10 times. At least one of the plurality of processors 110 according to some embodiments may form the pattern image III-c and the pattern image III-e as input channels or input layers of machine learning. Further, at least one of the plurality of processors 110 according to some embodiments may generate a pattern image I-f obtained by zooming out the pattern image I-d by 10 times. At least one of the plurality of processors 110 according to some embodiments may form the pattern image I-d and the pattern image I-f as input channels or input layers of machine learning. Further, at least one of the plurality of processors 110 according to some embodiments may generate a pattern image II-f obtained by zooming out the pattern image II-d by 10 times. At least one of the plurality of processors 110 according to some embodiments may form the pattern image II-d and the pattern image II-f as input channels or input layers of machine learning. Further, at least one of the plurality of processors 110 according to some embodiments may generate a pattern image III-f obtained by zooming out the pattern image III-d by 10 times. At least one of the plurality of processors 110 according to some embodiments may form the pattern image III-d and the pattern image III-f as input channels or input layers of machine learning.

Alternatively, at least one of the plurality of processors 110 according to some embodiments may generate a pattern image I-e obtained by zooming out the pattern image I-a of FIG. 4a by 100 times. At least one of the plurality of processors 110 according to some embodiments may form the pattern image I-a, the pattern image I-c and the pattern image I-e as input channels or input layers of machine learning. Further, at least one of the plurality of processors 110 according to some embodiments may generate a pattern image II-e obtained by zooming out the pattern image II-a of FIG. 4a by 100 times. For example, at least one of the plurality of processors 110 according to some embodiments may form the pattern image II-a, the pattern image II-c and the pattern image II-e as input channels or input layers of machine learning. Further, at least one of the plurality of processors 110 according to some embodiments may generate a pattern image III-e obtained by zooming out the pattern image III-a of FIG. 4a by 100 times. At least one of the plurality of processors 110 according to some embodiments may form the pattern image III-a, the pattern image III-c and the pattern image III-e as input channels or input layers of machine learning. Further, at least one of the plurality of processors 110 according to some embodiments may generate a pattern image I-f obtained by zooming out the pattern image I-b of FIG. 4a by 100 times. At least one of the plurality of processors 110 according to some embodiments may form the pattern image I-b, the pattern image I-d and the pattern image I-f as input channels or input layers of machine learning. Further, at least one of the plurality of processors 110 according to some embodiments may generate a pattern image II-f by zooming out the pattern image II-b of FIG. 4a by 100 times. At least one of the plurality of processors 110 according to some embodiments may form the pattern image II-b, the pattern image II-d and the pattern image II-f as input channels or input layers of machine learning. Further, at least one of the plurality of processors 110 according to some embodiments may generate a pattern image III-f obtained by zooming out the pattern image III-b of FIG. 4a by 100 times. At least one of the plurality of processors 110 according to some embodiments may form the pattern image III-b, the pattern image III-d and the pattern image III-f as input channels or input layers of machine learning.

Referring to FIGS. 1 and 2 again, at least one of the plurality of processors 110 according to some embodiments zooms in or zooms out (e.g., obtains different magnification versions of) the images generated through the image conversion of layout at a plurality of magnifications (S100), generates a plurality of input channels to be input to machine learning (S200), and then may perform machine learning to predict after-cleaning image (ACI) (S300).

An operation in which the plurality of processors 110 according to some embodiments predicts the after-cleaning image (ACI) through machine learning will be explained in detail through FIG. 5.

Figure 5:
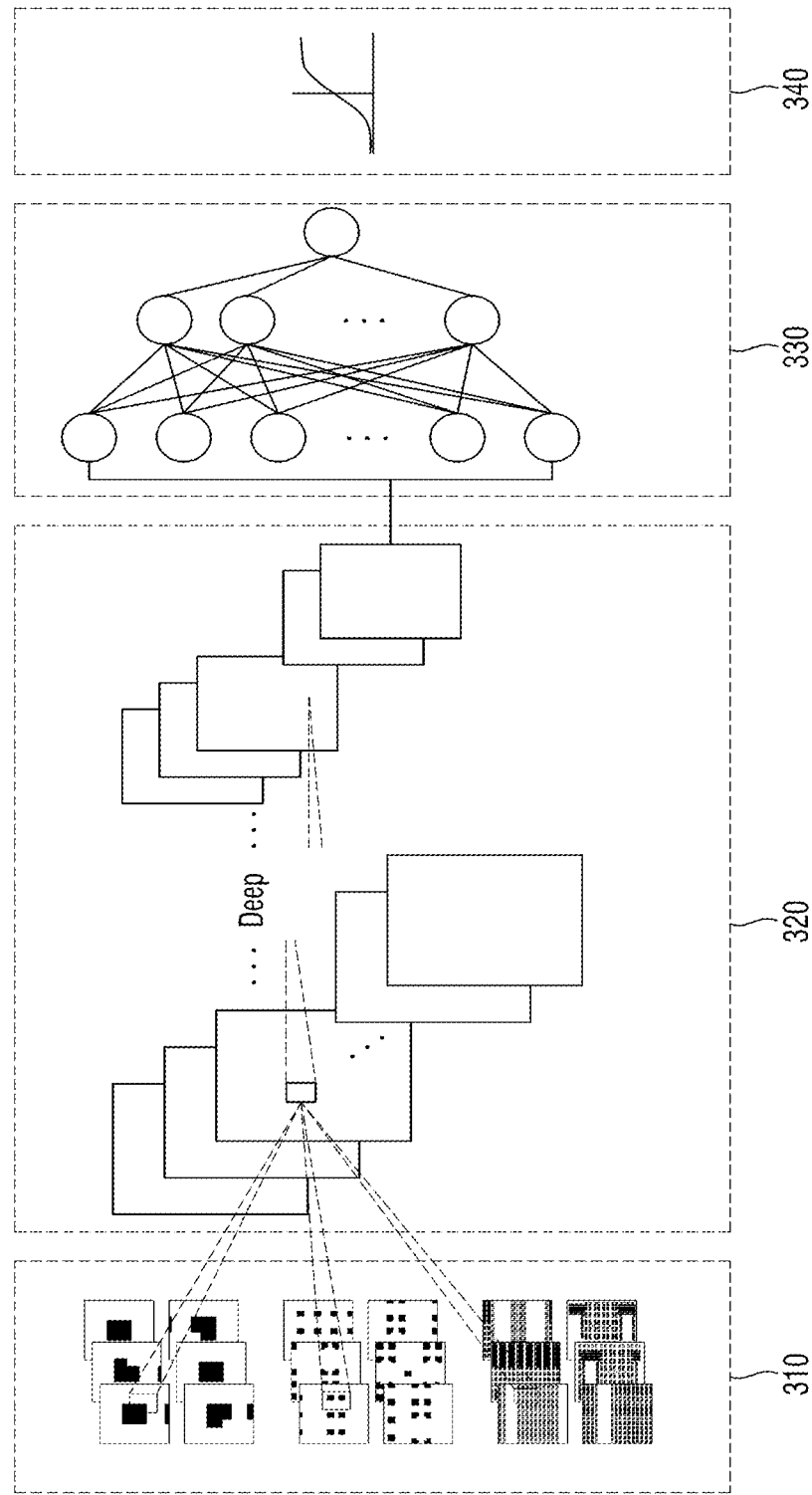
FIG. 5 is an exemplary diagram showing a method of predicting an after-cleaning image (ACI) through machine learning according to some embodiments.

FIG. 5 is an exemplary diagram showing a method of predicting an after-cleaning image (ACI) through machine learning according to some embodiments.

Referring to FIGS. 1 and 5, at least one of the plurality of processors 110 according to some embodiments may predict the after-cleaning image (ACI) on the basis of a neural network.

Hereinafter, it is explained that at least one of the plurality of processors 110 according to some embodiments predicts an after-cleaning image (ACI) through a convolutional neural network (CNN) 320. However, at least one of the plurality of processors 110 according to some embodiments may predict after-cleaning image (ACI), using a generative adversarial network (GAN), an artificial neural network (ANN), or the like, without being limited thereto.

At least one of the plurality of processors 110 according to some embodiments may receive a plurality of input channels 310 explained in FIGS. 4a to 4c, as an input of the convolutional neural network (CNN) 320. As mentioned above, the number and type of the plurality of channels 310 received by at least one of the plurality of processors 110 according to some embodiments as the input of the convolutional neural network 320 are not limited to FIGS. 4a to 4c.

When receiving the plurality of input channels 310 as the input of the convolutional neural network 320, at least one of the plurality of processors 110 according to some embodiments may receive information on the plurality of patterns of the target layout together and predict an after-cleaning image (ACI).

Information on the plurality of patterns may be, for example, the number of the plurality of patterns in the target layout. Or, information on the plurality of patterns may be, for example, an area occupied by each of the plurality of patterns in the target layout. Or, information on the plurality of patterns may be, for example, a density occupied by each of the plurality of patterns in the target layout. Information on the plurality of patterns is not limited to the aforementioned information. Further, information on the plurality of patterns may be a combination of the aforementioned information.

A plurality of convolutional layers may be placed in the convolutional neural network 320 network according to some embodiments. Although it is not shown, pooling layers may be placed between the plurality of convolution layers.

Outputs generated through the convolutional neural network 320 according to some embodiments may be input to the fully-connected neural network 330. The fully-connected neural network 330 may include a plurality of fully-connected layers.

After-cleaning images predicted through the fully-connected neural network 330 are repeatedly calculated through a regression network 340 to generate a target layout. Since the operation calculated repeatedly through the regression network 340 will be explained in detail through FIG. 6 below, the explanation is not provided in this paragraph.

Referring to FIGS. 1 and 2 again, at least one of the plurality of processors 110 according to some embodiments zooms in or zooms out the image generated through the layout image conversion (S100) at a plurality of magnifications to generate a plurality of input channels to be input to machine learning (S200), and then, performs machine learning to predict an after-cleaning image (ACI) (S300), and generates an after-cleaning image (ACI) error value through comparison with the after-cleaning image (ACI) target value (S400).

After that, at least one of the plurality of processors 110 according to some embodiments determines whether the after-cleaning image (ACI) error value is within an acceptable range (S500). If at least one of the plurality of processors 110 according to some embodiments determines that the after-cleaning image (ACI) error value is not within the acceptable range (N), it adjusts the layout and converts the layout into an image on the basis of the adjusted layout (S100). A similar process may be carried out for each differently magnified image, and in some cases, the results for the different magnified images may be analyzed together to determine whether to continue with further process proximity correction steps. This will be described further below.

Figure 6:
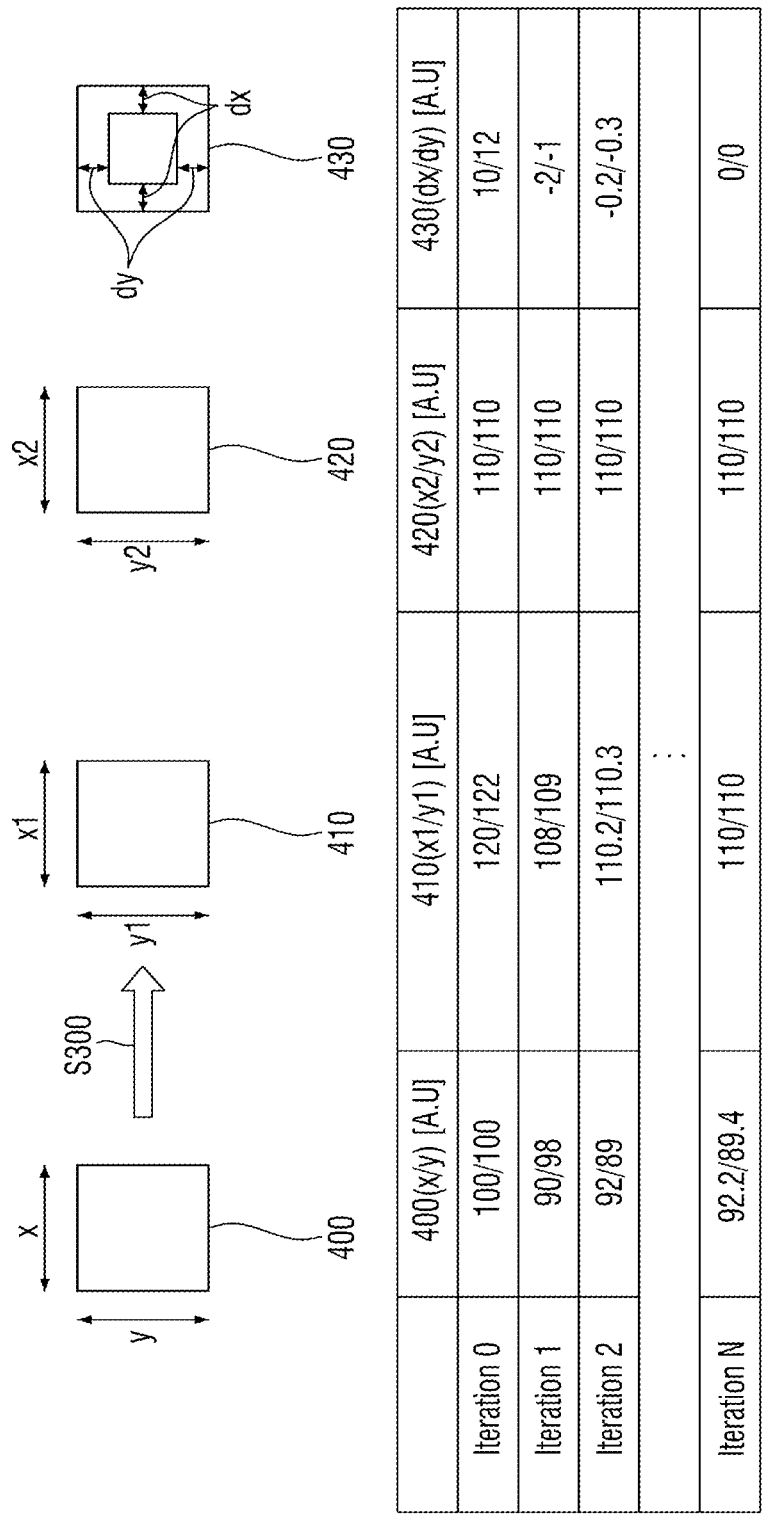
FIG. 6 is an exemplary diagram showing a method of adjusting an image on the basis of an after-cleaning image error according to some embodiments.

A process in which at least one of a plurality of processors 110 according to some embodiments performs machine learning to predict after-cleaning image (ACI) (S300), generates after-cleaning image (ACI) error values through comparison with the after-cleaning image (ACI) target value (S400), determines whether the after-cleaning image (ACI) error value is within an acceptable range (S500), and then, if it is determined that the after-cleaning image (ACI) error value is not within the acceptable range (N), at least one of the plurality of processors 110 according to some embodiments adjusts the layout and converts the layout into an image on the basis of the adjusted layout (S100) will be explained as an example through FIG. 6.

FIG. 6 is an exemplary diagram showing a method of adjusting an image on the basis of after-cleaning image error according to some embodiments.

Referring to FIGS. 1 and 6, an iteration is performed in which at least one of a plurality of processors 110 according to some embodiments performs machine learning to predict an after-cleaning image (ACI), generates an after-cleaning image (ACI) error value through comparison with the after-cleaning image (ACI) target value, determines whether the after-cleaning image (ACI) error value is within an acceptable range, and then, if it is determined that the after-cleaning image (ACI) error value is not within the acceptable range, at least one of the plurality of processors 110 according to some embodiments adjusts the layout and converts the layout into an image on the basis of the adjusted layout.

In detail, at least one of the plurality of processors 110 according to some embodiments converts the target layout 400 into an image through a 0th iteration (Iteration 0), and then performs machine learning by inputting image conversion information (S300). For example, vertical/horizontal lengths of the pattern in the 0th iteration (Iteration 0) of the target layout 400 are set as 100/100, respectively. For convenience of explanation, the unit is assumed to be an arbitrary unit (A.U).

At least one of the plurality of processors 110 according to some embodiments generates the predicted after-cleaning image 410 through the 0th iteration (Iteration 0). For example, the vertical/horizontal lengths of the pattern at the 0th iteration (Iteration 0) of the predicted after-cleaning image 410 are set as 120/122, respectively. For convenience of explanation, the unit is assumed to be an arbitrary unit (A.U).

At least one of the plurality of processors 110 according to some embodiments compares a predicted after-cleaning image 410 with a target value (or a target after-cleaning image value) 420 through the 0th iteration (Iteration 0) to generate after-cleaning image error 430. In all the following explanations, the target value (or target after-cleaning image value 420 will be explained as 110/110 as an example.

For example, the vertical/horizontal lengths of the pattern in the 0th iteration (Iteration 0) of after-cleaning image error 430 are set as 10/12, respectively. For convenience of explanation, the unit is assumed to be an arbitrary unit (A.U). At this time, although after-cleaning image error 430 is defined as a value obtained by subtracting the predicted after-cleaning image 410 from the target value 420, the after-cleaning image error 430 is not limited thereto. For example, the after-cleaning image error 430 may also be defined as a value obtained by subtracting the target value 420 from the predicted after-cleaning image 410.

At this time, if it is determined that after-cleaning image error 430 is within the permissible range, at least one of the plurality of processors 110 according to some embodiments stops execution of the process proximity correction. However, if it is determined that the after-cleaning image error 430 is not within the permissible range, at least one of the plurality of processors 110 according to some embodiments corrects the target layout 400 and performs a new iteration. Hereinafter, a case of performing a first iteration (Iteration 1) after the 0th iteration (Iteration 0) will be assumed.

At least one of the plurality of processors 110 according to some embodiments may correct the vertical/horizontal lengths of the target layout 400 to 90/98 after the 0th iteration (Iteration 0). That is, the vertical/horizontal lengths of the target layout 400 in the first iteration (Iteration 1) may be 90/98. After converting the target layout 400 in the first iteration (Iteration 1) into an image, machine learning is performed by inputting the image conversion information (S300). For example, the vertical/horizontal lengths of the pattern in the first iteration (Iteration 1) of the target layout 400 are set as 90/98, respectively. For convenience of explanation, the unit is assumed to be an arbitrary unit (A.U).

At least one of the plurality of processors 110 according to some embodiments generates the predicted after-cleaning image 410 through the first iteration (Iteration 1). For example, the vertical/horizontal lengths of the pattern in the first iteration (Iteration 1) of the predicted after-cleaning image 410 are set as 108/109, respectively. For convenience of explanation, the unit is assumed to be an arbitrary unit (A.U).

At least one of the plurality of processors 110 according to some embodiments compares predicted after-cleaning image 410 with a target value (or target after-cleaning image value 420) through the first iteration (Iteration 1) to generate after-cleaning image error 430. For example, the vertical/ horizontal lengths of the pattern in the first iteration (Iteration 1) of after-cleaning image error 430 are set as −2/−1, respectively. For convenience of explanation, the unit is assumed to be an arbitrary unit (A.U). At this time, although the after-cleaning image error 430 is defined as a value obtained by subtracting the predicted after-cleaning image 410 from the target value 420, the after-cleaning image error 430 is not limited thereto. For example, the after-cleaning image error 430 may also be defined as the value obtained by subtracting the target value 420 from the predicted after-cleaning image 410.

At this time, if at least one of the plurality of processors 110 according to some embodiments determines that after-cleaning image error 430 is within the permissible range, the process proximity correction is stopped. However, if at least one of the plurality of processors 110 according to some embodiments determines that the after-cleaning image error 430 is not within the permissible range, the target layout 400 is corrected and a new iteration is performed. Hereinafter, a case of performing a second iteration (Iteration 2) after the first iteration (Iteration 1) will be assumed.

At least one of the plurality of processors 110 according to some embodiments may correct the vertical/horizontal lengths of the target layout 400 to 92/89 after the first iteration (Iteration 1). That is, the vertical/horizontal lengths of the target layout 400 in the second iteration (Iteration 2) may be 92/89. After converting the target layout 400 in the second iteration (Iteration 2) into an image, machine learning is performed by inputting the image conversion information (S300). For example, the vertical/horizontal lengths of the pattern in the second iteration (Iteration 2) of the target layout 400 are set as 92/89, respectively. For convenience of explanation, the unit is assumed to be an arbitrary unit (A.U).

At least one of the plurality of processors 110 according to some embodiments generates the predicted after-cleaning image 410 through the second iteration (Iteration 2). For example, the vertical/horizontal lengths of the pattern in the second iteration (Iteration 2) of the predicted after-cleaning image 410 are set as 110.2/110.3, respectively. For convenience of explanation, the unit is assumed to be an arbitrary unit (A.U).

At least one of the plurality of processors 110 according to some embodiments compares the predicted after-cleaning image 410 with a target value (or a target after-cleaning image value 420) through the second iteration (Iteration 2) to generate after-cleaning image error 430. For example, the vertical/horizontal lengths of the pattern in the second iteration (Iteration 2) of after-cleaning image error 430 are set as −0.2/−0.3, respectively. For convenience of explanation, the unit is assumed to be an arbitrary unit (A.U). At this time, although the after-cleaning image error 430 is defined as a value obtained by subtracting the predicted after-cleaning image 410 from the target value 420, the after-cleaning image error 430 is not limited thereto. For example, the after-cleaning image error 430 may also be defined as a value obtained by subtracting the target value 420 from the predicted after-cleaning image 410.

At this time, if at least one of the plurality of processors 110 according to some embodiments determines that after-cleaning image error 430 is within the permissible range, the process proximity correction is stopped. However, if at least one of the plurality of processors 110 according to some embodiments determines that the after-cleaning image error 430 is not within the permissible range, the target layout 400 is corrected and a new iteration is performed. Hereinafter, a case of performing an Nth iteration (Iteration N) after a plurality of iterations after the second iteration (Iteration 2) is assumed (N is a natural number greater than 2).

At least one of the plurality of processors 110 according to some embodiments may correct the vertical/horizontal lengths of the target layout 400 to 92.2/89.4 after the N−1 iteration (Iteration N−1). That is, the vertical/horizontal lengths of the target layout 400 in the Nth iteration (Iteration N) may be 92.2/89.4. After converting the target layout 400 in the Nth iteration (Iteration N) into an image, machine learning is performed by inputting the image conversion information (S300). For example, the vertical/horizontal lengths of the pattern in the Nth iteration (Iteration N) of the target layout 400 are set as 92.2/89.4, respectively. For convenience of explanation, the unit is assumed to be an arbitrary unit (A.U).

At least one of the plurality of processors 110 according to some embodiments generates the predicted after-cleaning image 410 through the Nth iteration (Iteration N). For example, the vertical/horizontal lengths of the pattern in the Nth iteration (Iteration N) of the predicted after-cleaning image 410 are set as 110/110, respectively. For convenience of explanation, the unit is assumed to be an arbitrary unit (A.U).

At least one of the plurality of processors 110 according to some embodiments compares the predicted after-cleaning image 410 with a target value (or a target after-cleaning image value 420) through the Nth iteration (Iteration N) to generate after-cleaning image error 430. For example, the vertical/horizontal lengths of the pattern in the Nth iteration (Iteration N) of after-cleaning image error 430 are set as 0/0, respectively. For convenience of explanation, the unit is assumed to be an arbitrary unit (A.U). At this time, although the after-cleaning image error 430 is defined as a value obtained by subtracting the predicted after-cleaning image 410 from the target value 420, the after-cleaning image error 430 is not limited thereto. For example, the after-cleaning image error 430 may also be defined as a value obtained by subtracting the target value 420 from the predicted after-cleaning image 410.

At this time, since the after-cleaning image error 430 is 0, at least one processor among the plurality of processors 110 according to some embodiments stops the execution of the process proximity correction.

Referring FIGS. 1 and 2 again, when at least one of the plurality of processors 110 according to some embodiments determines that the after-cleaning image (ACI) error value is within an acceptable range (Y), the layout adjustment is not performed, and execution of the process proximity correction is stopped.

The process discussed in connection with FIG. 6 may be carried out for each differently magnified target layouts and associated images to result a plurality of different predicted after-cleaning images. In some embodiments, at each iteration, the plurality of different predicted after-cleaning images (e.g., based on different respective magnifications) may be used both to determine whether the target values are within the acceptable image error, and to determine how to adjust the target layout in the next iteration. For example, in some embodiments, all of the different predicted after-cleaning images must be within the acceptable image error for the process proximity correction process to stop. Or in other embodiments, a certain percentage (e.g., more than 50%) of the different predicted after-cleaning images must be within the acceptable image error for the process proximity correction process to stop. In some embodiments, a machine. learning uses all three differently-magnified images to perform analysis on different aspects of the target layout pattern and to result in a single after-cleaning image.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A process proximity correction method performed by a process proximity correction computing device which performs a process proximity correction (PPC) through at least one of a plurality of processors, the process proximity correction method comprising:
   converting a target layout including a plurality of patterns into an image;
   zooming-in or zooming-out the image at a plurality of magnifications to generate a plurality of input channels;
   receiving the plurality of input channels and performing machine learning to predict an after-cleaning image (ACI);
   comparing the predicted after-cleaning image with a target value to generate an after-cleaning image error; and
   adjusting the target layout on the basis of the after-cleaning image error.

2. The process proximity correction method of claim 1, wherein the machine learning includes deep learning.

3. The process proximity correction method of claim 2, wherein the deep learning uses a generative adversarial network (GAN).

4. The process proximity correction method of claim 2, wherein the deep learning uses a convolutional neural network (CNN).

5. The process proximity correction method of claim 2, wherein the deep learning uses an artificial neural network (ANN).

6. The process proximity correction method of claim 1, wherein, when the after-cleaning image error becomes 0, adjustment of the target layout is stopped.

7. The process proximity correction method of claim 1, wherein the machine learning includes receiving of information on the plurality of patterns to predict the after-cleaning image.

8. The process proximity correction method of claim 7, wherein information on the plurality of patterns includes the number of the plurality of patterns.

9. The process proximity correction method of claim 7, wherein information on the plurality of patterns includes areas of each of the plurality of patterns.

10. The process proximity correction method of claim 1, wherein conversion into the image uses a binary type.

11. The process proximity correction method of claim 1, wherein conversion into the image uses an overlap type.

12. The process proximity correction method of claim 1, wherein conversion into the image uses a level set type.

13. The process proximity correction method of claim 1, wherein prediction of the after-cleaning image includes prediction of a critical dimension (CD) of the after-cleaning image.

14. The process proximity correction method of claim 1, further comprising:
   predicting a plurality of after-cleaning images using the plurality of received input channels, respectively; and
   based on the plurality of after-cleaning images, determining whether to continue adjust the target layout or to stop further adjustment of the target layout.

15. A process proximity correction method of a process proximity correction computing device which performs a process proximity correction (PPC) through at least one of a plurality of processors, the process proximity correction method comprising:

converting a target layout including a plurality of patterns into a first image;

generating a first input channel by obtaining a first zoomed out version of the first image at a first magnification, and generating a second input channel by obtaining a second zoomed out version of the first image at a second magnification;

receiving the first input channel and the second input channel and performing machine learning to predict an after-cleaning image (ACI);

comparing the predicted after-cleaning image with a target value to generate after-cleaning image error; and adjusting the target layout and converting the target layout into a second image different from the first image, on the basis of the after-cleaning image error.

16. The process proximity correction method of claim 15, wherein when the after-cleaning image error becomes 0, adjustment of the target layout is stopped.

17. The process proximity correction method of claim 15, wherein the machine learning includes receiving of information on the plurality of patterns to predict the after-cleaning image.

18. The process proximity correction method of claim 15, wherein prediction of the after-cleaning includes prediction of a critical dimension (CD) of the after-cleaning image.

19. The process proximity correction method of claim 15, wherein the machine learning is performed using the first input channel and the second input channel to predict the ACI.

20. A process proximity correction computing device which includes a plurality of processors, wherein at least one of the plurality of processors executes a process proximity correction, and execution of the process proximity correction includes converting a target layout including a plurality of patterns into an image, zooming-in or zooming-out the image at a plurality of magnifications to generate a plurality of input channels, receiving the plurality of input channels and performing machine learning using the plurality of input channels, to predict after-cleaning image (ACI), comparing the predicted after-cleaning image with a target value to generate an after-cleaning image error, and adjusting the target layout on the basis of the after-cleaning image error.

* * * * *